United States Patent [19]
Kinoshita

[11] Patent Number: 5,843,828
[45] Date of Patent: Dec. 1, 1998

[54] METHOD FOR FABRICATING A SEMICONDUCTOR DEVICE WITH BIPOLAR TRANSISTOR

[75] Inventor: Yasushi Kinoshita, Tokyo, Japan

[73] Assignee: NEC Corporation, Tokyo, Japan

[21] Appl. No.: 593,416

[22] Filed: Jan. 29, 1996

[30] Foreign Application Priority Data

Jan. 30, 1995 [JP] Japan ................................. 7-013133

[51] Int. Cl.$^6$ ................................................ H01L 21/326
[52] U.S. Cl. ........................ 438/367; 438/368; 438/362
[58] Field of Search .................................. 438/367, 368, 438/362, 365, 364

[56] References Cited

U.S. PATENT DOCUMENTS

| | | | |
|---|---|---|---|
| 4,483,726 | 11/1984 | Isaac et al. | 148/187 |
| 4,994,400 | 2/1991 | Yamaguchi et al. | 437/31 |
| 4,996,581 | 2/1991 | Hamasaki | 437/31 |
| 5,599,723 | 2/1997 | Sato | 437/31 |

FOREIGN PATENT DOCUMENTS

0418185A1  3/1991  European Pat. Off. .

OTHER PUBLICATIONS

"A Novel Self–Aligned Epitaxial Base Transistor"; H. Fujimaki et al.; 1991 IEEE; Electron Devices Group, Tokyo, Japan; pp. 59–62.

T.H. Ning et al.; "Self–Aligned Bipolar Transistors for High–Performance and Low–Power–Delay VLSI"; IEEE Transactions on Electron Devices, vol. ED–28, No. 9 Sep. 1981, pp. 1010–1013.

*Primary Examiner*—Tuan H. Nguyen
*Attorney, Agent, or Firm*—Whitham, Curtis & Whitham

[57] ABSTRACT

A semiconductor device with a bipolar transistor that enables to realize a reliable, electric connection of an intrinsic base region with a base electrode is provided. A semiconductor substructure has a surface area. An intrinsic base region is formed in the surface area. An emitter region is formed in the surface area to be surrounded by the intrinsic base region, and an emitter electrode is formed to be contacted with the emitter region. An insulator is formed to surround the emitter electrode. A base electrode is formed not to be contacted with the intrinsic base region A conductive region is formed to be contacted with the intrinsic base region and the base electrode. The substructure has a recess formed on the surface area. The conductive region is produced by supplying a conductive material to the recess to be contacted with the intrinsic base region and the base electrode. The intrinsic base region is electrically connected to the base electrode through the conductive region. The recess is preferably produced by oxidizing a part of the surface area to form an oxide and removing the oxide.

12 Claims, 9 Drawing Sheets

METHOD FOR FABRICATING A SEMICONDUCTOR DEVICE WITH BIPOLAR TRANSISTOR

BACKGROUND OF THE INVENTION

1. Field of the Invention

The present invention relates to a semiconductor device and more particularly, to a semiconductor device having a bipolar transistor that enables a reliable, electric connection of an intrinsic base region with a base electrode and a fabrication method thereof.

2. Description of the Prior Art

Conventionally, bipolar transistors have been employed for semiconductor integrated circuits applicable to the telecommunication technology covering GHz-frequency range because of their high-speed performance.

To obtain the high-speed performance of the bipolar transistors, it is essential for the intrinsic base region through which carriers flow to be as thin as possible. Also, it is necessary for the parasitic resistances and parasitic capacitances accompanied by the emitter, base and collector regions and their electrodes to be as small as possible. To reduce the parasitic capacitances, miniaturization of the transistors is especially important, which requires a variety of sophisticated processing techniques.

Then, to improve the transistor performance independent of the minimum processible dimensions of the above sophisticated processing techniques, various self-alignment techniques were developed in which an emitter region was formed to be self-align to a base contact or a base electrode.

The conventional self-alignment techniques were based on the technique disclosed in IEEE Transactions on Electron Devices, Vol. ED-28, No. 9, pp1010–1013, September 1981. A typical fabrication method corresponding to the conventional self-alignment techniques is shown in FIGS. 1A to 1I. This method is applicable to Bipolar and Complementary Metal-Oxide-Semiconductor (Bi-CMOS) integrated circuit devices (ICs) containing bipolar transistors and CMOS field-effect transistors (FETs) on the same semiconductor substrate.

Although a bipolar or Bi-CMOS IC contains a large number of bipolar transistors that are formed on a semiconductor substrate and that have the same configuration, only one of the transistors is shown in the specification and attached drawings for the sake of simplification of description.

First, as shown in FIG. 1A, an $n^+$-buried layer 52 and a $p^+$-buried layer (not shown) are formed in a surface area of a p-type single-crystal silicon (Si) substrate 51. The $n^+$-buried layer 52 is formed by selectively doping arsenic (As) into the substrate 51, and is used as a collector connection region of a bipolar transistor. The $p^+$-buried layer is formed to surround the bipolar transistor (including the $n^+$-layer 52) by selectively doping boron (B) into the substrate 51, and is used for electrical isolation of this bipolar transistor from the other devices.

An n-type single-crystal silicon layer 53 is then epitaxially grown on the main surface of the substrate 51 to cover the $n^+$-buried layer 52 and the $p^+$-buried layer. The state at this stage is shown in FIG. 1A. The n-silicon epitaxial layer 53 has a flat surface 53a.

The combination of the silicon substrate 51, the $n^+$-buried layer 52, the $p^+$-buried layer, and the silicon epitaxial layer 53 constitute a substructure of the transistor or IC.

Next, an isolation insulator film (i.e., field insulator film) 54 of silicon dioxide ($SiO_2$) is selectively formed on the flat surface 53a of the epitaxial layer 53 by a LOCal Oxidation of Silicon (LOCOS) method, defining a device area 76 in which this bipolar transistor is fabricated. As shown in FIG. 1B, an upper portion of the film 54 in its cross section protrudes from the flat surface 53a, and a lower portion thereof sinks in the epitaxial layer 53.

The device area 76 is surrounded by the above $p^+$-buried layer for lateral, electrical isolation from the other devices.

An n-type impurity is selectively doped into the epitaxial layer 53 through the surface 53a, forming an $n^+$-collector contact region 55 in the device area 76. The bottom of the region 55 is contacted with the $n^+$-buried layer 52. The state at this stage is shown in FIG. 1B.

An $SiO_2$ film 56 is deposited over the entire substrate 51 by a Chemical Vapor Deposition (CVD) method. Then, the film 56 is selectively removed to thereby expose an emitter/base area 57 in which emitter and base regions are formed. The state at this stage is shown in FIG. 1C.

Subsequently, a p-polysilicon film 58 doped with boron is deposited over the entire substrate 51 by a CVD method. Then, an insulator film 59 is formed on the entire film 58.

To activate the doped boron atoms into the p-polysilicon film 58, the film 58 is subjected to a heat-treatment at a temperature of 900° to 950° C. for 10 to 30 minutes. During this heat-treatment process, the doped boron atoms in the film 58 are diffused into the n-silicon epitaxial layer 53 through the exposed surface 53a, selectively forming a p-diffusion region 80a in the emitter/base area 57. The region 80a has a depth of 50 to 100 nm and serves as an intrinsic base region and a link base region. The state at this stage is shown in FIG. 1D.

The polysilicon film 58 and the insulator film 59 are selectively removed to be patterned, forming a base electrode 61 in the emitter/base area 57, as shown in FIG. 1E. The base electrode 61 is contacted with the p-diffusion region 80a formed in the epitaxial layer 53 and is covered with the remaining insulator film 59.

The remaining insulator film 59 and the base electrode 61 are selectively etched by anisotropically etching processes, successively, thereby forming an emitter contact hole 81 extending vertically to the p-diffusion region 80a, as shown in FIG. 1F. This hole 81 needs to be formed with high accuracy because it defines the contours of the emitter region and the intrinsic base region. Therefore, anisotropically etching processes that enable to produce a vertical inner wall of the hole 81 should be employed.

To selectively remove the p-diffusion region 80a at a portion corresponding to the intrinsic base region, a surface area 81a of the epitaxial layer 53 needs to be selectively etched during the etching process for the base electrode 61, thereby exposing the layer 53 from the region 80a. Then, ionized boron atoms are selectively implanted into the layer 53 through the emitter contact hole 81 and the exposed surface 53a, forming a p-diffusion region 87a in the layer 53, as shown in FIG. 1F. The remaining diffusion region 80a constitutes a link base region 80 surrounding the region 87a.

A sidewall spacer 68a is formed on the inner wall of the emitter contact hole 81 and at the same time, a side wall spacer 68b is formed on the outer wall of the base electrode 61, as shown in FIG. 1G. The spacer 68a extends from the p-diffusion region 87a to the top of the insulator film 59. The spacer 68b extends from the $SiO_2$ film 56 to the top of the insulator film 59.

Subsequently, an emitter electrode 72 is formed to be contacted with the p-diffusion region 87a through the emitter contact hole 81. The emitter electrode 72 is electrically insulated from the base electrode 61 by the sidewall spacer 68a. Then, the n-impurity atoms doped into the electrode 72 are thermally diffused into the p-diffusion region 87a, thereby forming an n-emitter region 73 within the region 87a, as shown in FIG. 1H. The remaining region 87a constitutes the p-intrinsic base region 87.

An interlayer insulation film 74 is formed over the entire substrate 51. Then, three through holes are formed in the film 74 to vertically extend to the emitter electrode 72, the base electrode 61 and the $n^+$-collector contact region 55, respectively, as shown in FIG. 1I. An interconnection film of a metal such as aluminum (Al) is further formed to be patterned, thereby forming interconnection conductors 75a, 75b and 75c within the through holes in the film 74, respectively. Thus, the npn bipolar transistor is fabricated on the substrate 51.

As described above, in the above conventional fabrication method as shown in FIGS. 1A to 1I, the n-emitter region 73 is formed in self-alignment to the base electrode 61.

The above conventional method has the following problems.

First, in the process of forming the emitter contact hole 81 (see FIG. 1F), the surface area 81a of the epitaxial layer 53 needs to be selectively etched with high accuracy in order to produce the link base region 80. The etching depth of the area 81a needs to be determined according to the depth of the p-diffusion region 80a in the n-epitaxial layer 53. A typical depth of the region 80a is as small as 50 to 100 nm.

However, the etching depth of the surface area 81a is very difficult to be controlled accurately within the entire substrate 51 or wafer. Therefore, a good performance of the transistor cannot be realized with a high fabrication yield.

The cause of the difficulty in etching depth control is as follows:

The present anisotropic etching technology has not been able to produce a significant etch rate difference between polysilicon and single-crystal silicon. With the above conventional fabrication method, since the thick polysilicon base electrode 61 and the thin surface area 81a of the single-crystal silicon layer 53 are successively etched during the same etching process, the endpoint of this etching process is quite difficult to be detected.

The above etching difficulty is also due to the fact that the etching depth of the area 81a varies dependent upon the etch rate uniformity of the anisotropic dry etching process within the entire substrate 51.

If the etching depth of the single-crystal silicon layer 53 is smaller than the desired value, the boron atoms doped into the p-diffusion region 80a will be left and as a result, the depth of the intrinsic base region 87 will become large. This leads to degradation in high-frequency performance of the bipolar transistor..

On the other hand, if the etching depth of the single-crystal silicon layer 53 is larger than the desired value, the intrinsic base region 87 will tend to be apart from the link base region 80. This leads to open circuit between the intrinsic base region 87 and the link base region 80 or base resistance increase of the bipolar transistor.

Second, the surface area 81a of the n-epitaxial layer is etched by the anisotropic etching process and therefore, the intrinsic base region 87 tends to be damaged by the etching action. This causes degradation of the transistor performance.

SUMMARY OF THE INVENTION

Accordingly, an object of the present invention is to provide a semiconductor device with a bipolar transistor that enables to realize a reliable, electric connection of an intrinsic base region with a base electrode and a fabrication method thereof.

Another object of the present invention is to provide a semiconductor device with a bipolar transistor that enables to cancel the possibility of damage to an intrinsic base region and a fabrication method thereof.

These objects together with others not specifically mentioned will become clear to those skilled in the art from the following description.

According to a first aspect of the present invention, a semiconductor device with a bipolar transistor is provided, which includes a semiconductor substructure having a surface area of a first conductivity type, an intrinsic base region of a second conductivity type formed in the surface area, an emitter region of the first conductivity type formed in the surface area to be surrounded by the intrinsic base region, an emitter electrode formed to be contacted with the emitter region, an insulator formed to surround the emitter electrode, a base electrode formed not to be contacted with the intrinsic base region, and a conductive region formed to be contacted with the intrinsic base region and the base electrode.

The base electrode is electrically insulated from the emitter electrode by the insulator. The substructure has a recess or depression formed on the surface area. The conductive region is produced by supplying a conductive material to the recess to be contacted with the intrinsic base region and the base electrode. Thus, the intrinsic base region is electrically connected to the base electrode through the conductive region.

With the semiconductor device according to the first aspect, the substructure has the recess or depression formed on the surface area, and the conductive region is produced by supplying the conductive material to the recess to be contacted with the intrinsic base region and the base electrode. Therefore, the base electrode can be electrically connected to the intrinsic base region by the conductor region with high reliability.

Also, since no region or layer serving as a link base region needs to be formed on an area where the intrinsic base region is formed, there is no possibility of damage to the intrinsic base region.

In a preferred embodiment of the semiconductor device according to the first aspect, the recess is produced by oxidizing a part of the surface area of the substructure to form an oxide thereon, and removing the oxide from the surface area.

According to a second aspect of the present invention, a fabrication method of a semiconductor device is provided, which includes the following steps:

A semiconductor substructure having a surface area of a first conductivity type is prepared, and then, a recess or depression is formed on the surface area. Further, an intrinsic base region of a second conductivity type is formed in the surface area, an emitter region of the first conductivity type is formed in the surface area to be surrounded by the intrinsic base region, an emitter electrode is formed to be contacted with the emitter region, an insulator is formed to surround the emitter electrode, a base electrode is formed not to be contacted with the intrinsic base region and to be electrically insulated by the insulator from the emitter electrode, and a conductive region is formed to be contacted with the intrinsic base region and the base electrode. A conductive material is supplied to the recess to produce the conductive region. Thus, the intrinsic base region is electrically connected to the base electrode through the conductive region.

With the fabrication method of a semiconductor device according to the second aspect, the recess is formed on the surface area of the substructure and then, the conductive material is supplied to the recess to thereby form the conductive region. Further, the intrinsic base region is electrically connected to the base electrode through the conductive region. Therefore, the base electrode can be electrically connected to the intrinsic base region through the conductor region with high reliability.

Also, no region or layer serving as a link base region needs to be formed on an area where the intrinsic base region is formed. As a result, there is no possibility of damage to the intrinsic base region.

In a preferred embodiment of the method according to the second aspect, the recess is produced by oxidizing a part of the surface area of the substructure to form an oxide thereon, and removing the oxide from the surface area. In this case, the oxide preferably has a laterally protruding end whose cross-section is of a bird's beak.

The oxide may be formed in the same process step of forming an isolation insulator film. In this case, a conductive material for the base electrode is formed on the oxide, an emitter contact hole penetrating the material is formed to expose the oxide, and then the oxide is removed by wet etching through the emitter contact hole.

The oxide may be formed in a different process step from that of forming an isolation insulator film. In this case, an insulator film is formed on the surface area of the substructure, a conductive material for the base electrode is formed on the insulator film, an emitter contact hole penetrating the material is formed to expose the insulator film, and then the insulator film is removed by wet etching through the emitter contact hole.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described in detail below while referring to FIGS. 2A to 2J and FIGS. 3A to 3J.

FIRST EMBODIMENT

In a fabrication method of a semiconductor device with a bipolar transistor according to a first embodiment, the following process steps are performed.

Figure 1A:
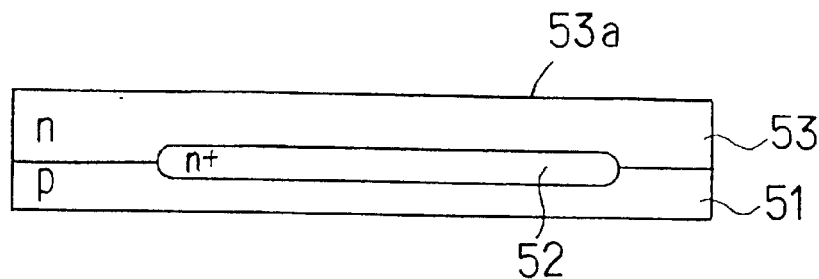
FIGS. 1A to 1I are partial cross-sectional views of a conventional semiconductor device with a bipolar transistor, which shows its fabrication process sequence, respectively.
Figure 1B:
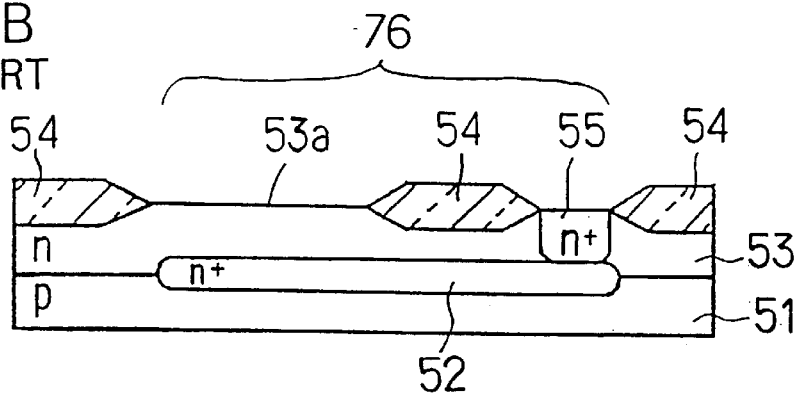
Figure 1C:
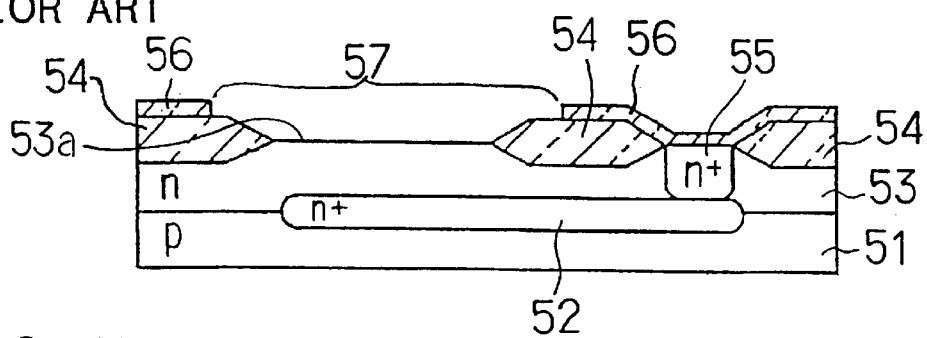
Figure 1D:
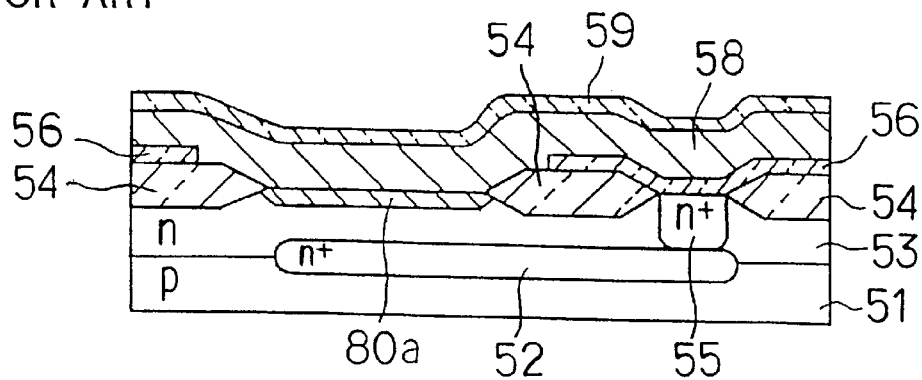
Figure 1E:
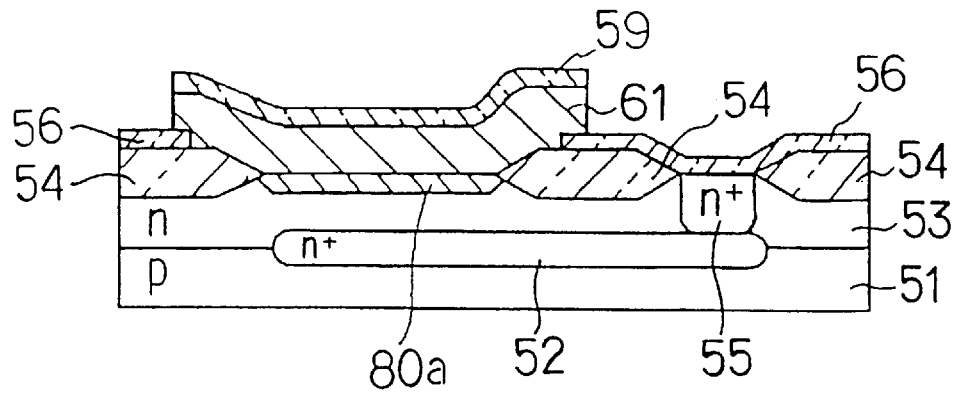
Figure 1F:
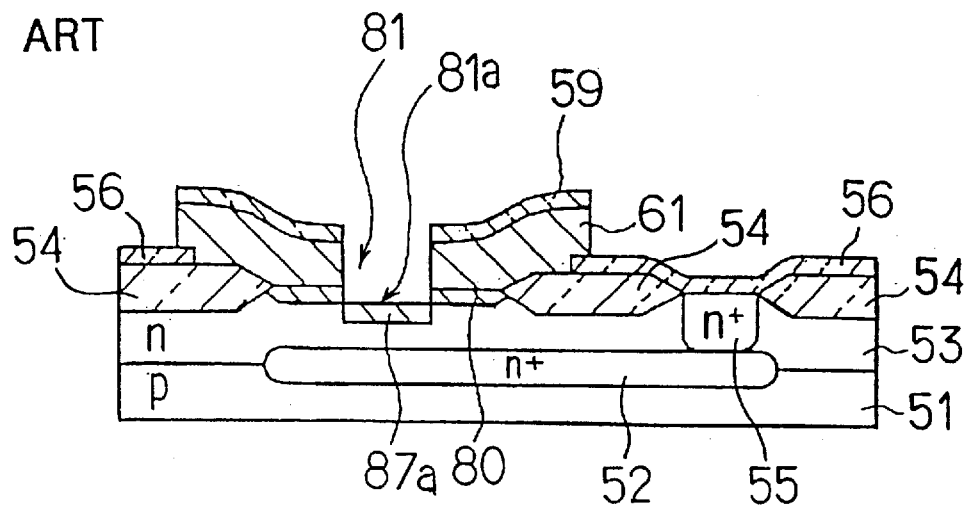
Figure 1G:
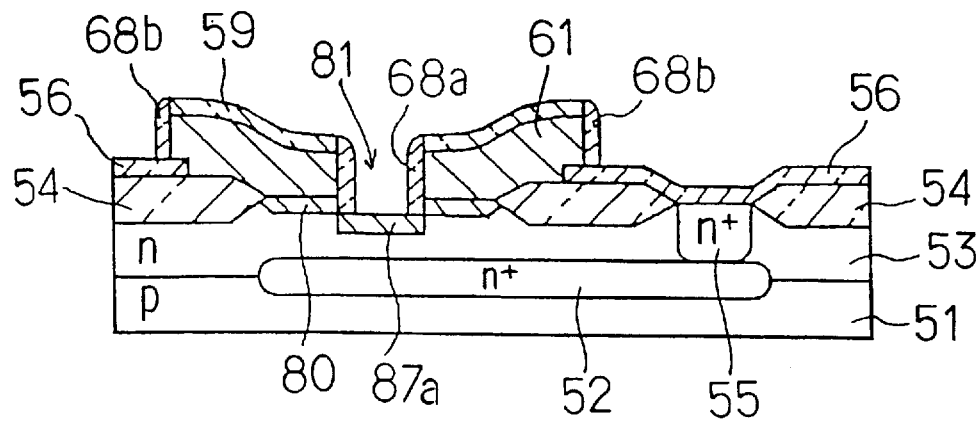
Figure 1H:
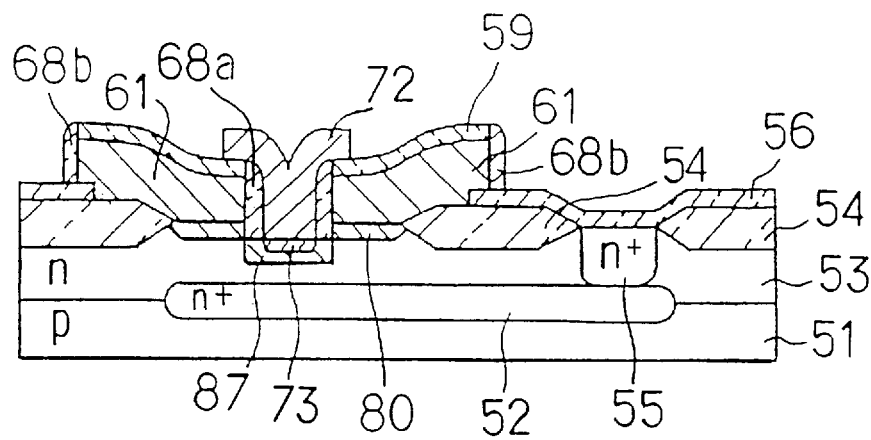
Figure 1I:
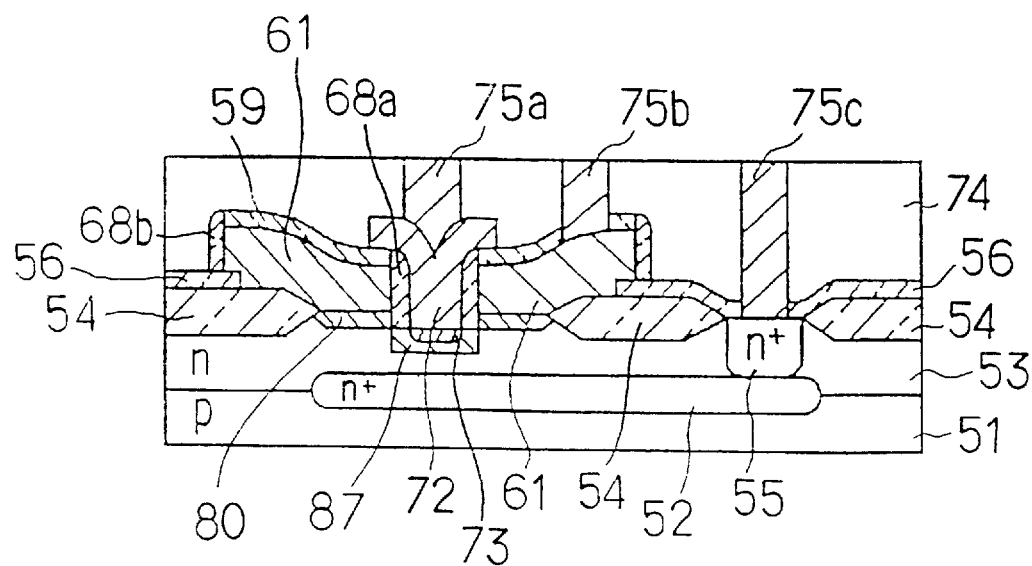
Figure 2A:
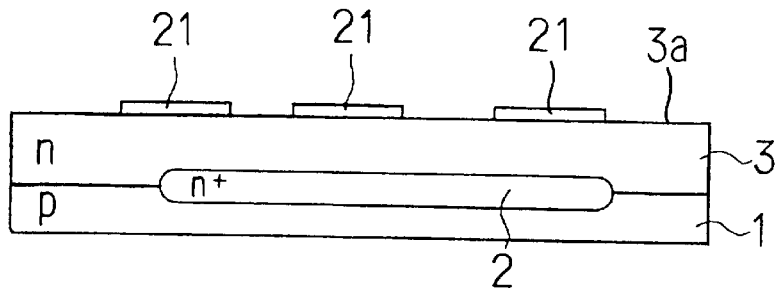
FIGS. 2A to 2J are partial cross-sectional views of a semiconductor device with a bipolar transistor according to a first embodiment of the invention, which shows its fabrication process sequence, respectively.

First, as shown in FIG. 2A, an $n^+$-buried layer 2 and a $p^+$-buried layer (not shown) are formed in a surface area of a p-type single-crystal silicon substrate 1. The $n^+$-buried layer 2 is formed by selectively doping arsenic into the substrate 1, and is used as a collector connection region of the bipolar transistor. The $p^+$-buried layer is formed to surround the bipolar transistor (including the $n^+$-layer 2) by selectively doping boron into the substrate 1, and is used for electrical isolation of this bipolar transistor from the other devices. The above doping processes may be performed by ion-implantation or the like.

An n-type single-crystal silicon layer 3 with a thickness of 0.5 to 2.0 μm is then epitaxially grown on the main surface of the substrate 1 to cover the $n^+$-buried layer 2 and the $p^+$-buried layer. The n-silicon epitaxial layer 3 has a flat surface 3a, as shown in FIG. 2A.

Here, the combination of the silicon substrate 1, the $n^+$-buried layer 2, the $p^+$-buried layer, and the n-silicon epitaxial layer 3 constitute a substructure of the transistor or IC.

Next, a p-well (not shown) is formed over the above $p^+$-buried layer within the n-silicon epitaxial layer 3 by an ion-implantation technique or the like. After an $SiO_2$ film (not shown) is formed on the flat surface 3a of the layer 3, a silicon nitride ($Si_3N_4$) film 21 is then formed on the $SiO_2$ film. The $SiO_2$ and $Si_3N_4$ films are then patterned as shown in FIG. 2A. These films serve as an oxidization-resistance pattern.

Using the patterned $SiO_2$ and $Si_3N_4$ films as a mask, an isolation insulator film (i.e., field insulator film) 4 and a space-formation insulator film 14 are selectively formed on the flat surface 3a of the epitaxial layer 3. The film 14 is surrounded or confined by the film 4. The films 4 and 14 are made of $SiO_2$ and 300 to 400 nm in thickness. The films 4 and 14 are formed by a LOCOS method in which the n-silicon epitaxial layer 3 is thermally oxidized at a high temperature in an oxidizing atmosphere.

Figure 2B:
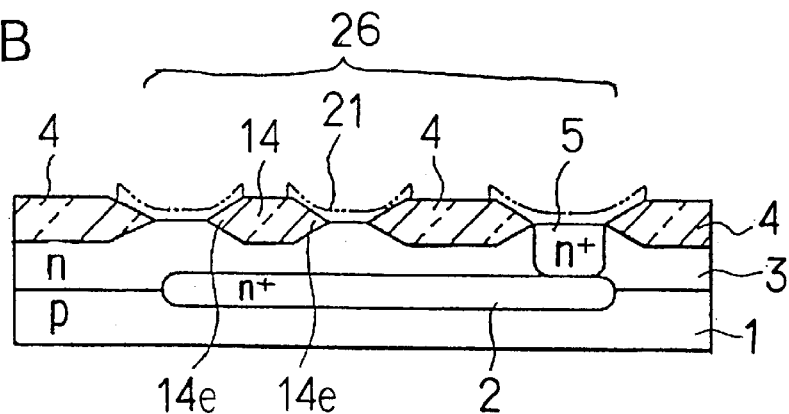

The film 4 defines a device area 26 in which this bipolar transistor is fabricated, laterally isolating the area 26 from the other devices. The film 14, which is formed to be an island, defines a space or vacancy for electric connection between an intrinsic base region and a base electrode 11. As shown in FIG. 2B, an upper part of the film 4 in its cross section protrudes from the flat surface 3a, and a lower part thereof sinks in the epitaxial layer 3. The $SiO_2$ film and the $Si_3N_4$ film 21 used as the mask is then removed. The state at this stage is shown in FIG. 2B.

Since the space-formation insulator film 14 is formed by the LOCOS method, it has a laterally protruding end portion 14e termed the "bird's beak" at each end of its cross section. The end portion 14e has a thickness gradually decreasing from the central portion toward the edge.

Next, an n-type impurity such as phosphorus (P) is selectively doped into the epitaxial layer 3 through its surface 3a by an ion-implantation technique or the like. Then, the layer 3 is subjected to a heat-treatment at 900° to 1000° C. for 10 to 30 minutes for activation of the doped impurity. Thus, an $n^+$-collector contact region 5 is formed in the layer 3, as shown in FIG. 2B. The bottom of the region 5 is contacted with the $n^+$-buried layer 2.

The device area 26 is laterally isolated from the other devices by the isolation film 4, the $p^+$-buried layer and the p-well.

Figure 2C:
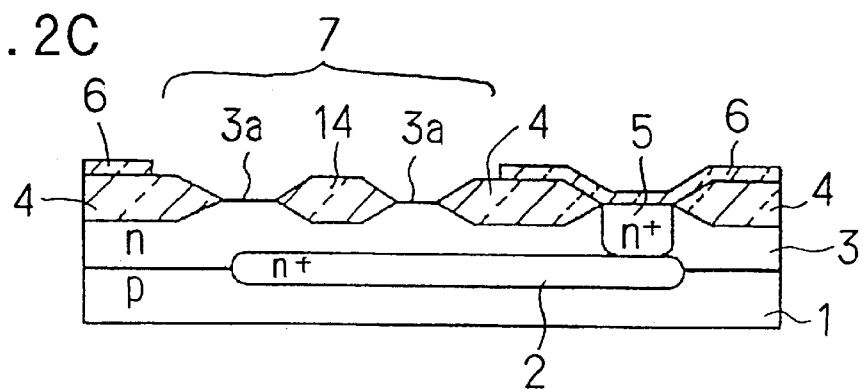

An $SiO_2$ film 6 with a thickness of 50 to 100 nm is deposited over the entire substrate 1 by a CVD method. Then, the film 6 is selectively removed to thereby expose an emitter/base area 7 in which emitter and base regions are formed. This process is performed by a wet etching in order to avoid any damage to the epitaxial layer 3. The state at this stage is shown in FIG. 2C.

Subsequently, a p-polysilicon film 8 with a thickness of 300 to 400 nm is deposited over the entire substrate 1 by a CVD method. The film 8 is obtained by doping the p-type impurity such as boron during the CVD process. However, the film 8 may be produced by doping the p-type impurity by an ion-implantation method into an undoped polysilicon film which has been previously deposited.

Figure 2D:
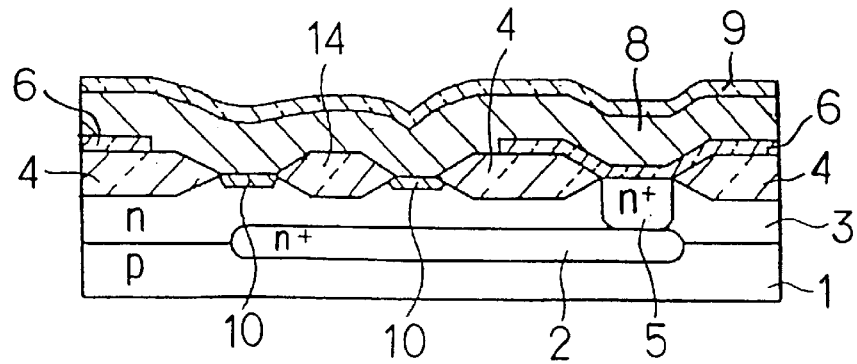

An insulator film 9 such as $Si_3N_4$ is formed on the p-polysilicon film 8 over the entire substrate 1. The film 8 is then subjected to a heat-treatment at a temperature of 900° to 950° C. for 10 to 30 minutes to activate the p-impurity contained in the film 8. During this heat-treatment process, the doped p-impurity atoms in the film 8 are diffused into the n-silicon epitaxial layer 3 through its exposed surface 3a, selectively forming a p-diffusion region 10 in the emitter/base area 7. The state at this stage is shown in FIG. 2D.

The p-diffusion region 10 surrounds the space-formation film 14 of $SiO_2$ and has a depth of 50 to 100 nm from the surface 3a. The region 10 serves as a part of link base region for electrically connecting the intrinsic base region and the base electrode.

Figure 2E:
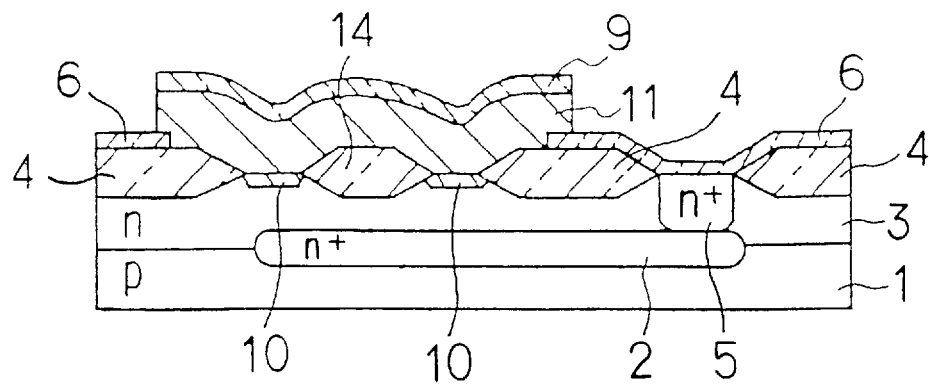

Next, the p-polysilicon film 8 and the insulator film 9 are selectively removed to be patterned by sophisticated processing techniques, forming the base electrode 11 in the emitter/base area 7, as shown in FIG. 2E. The base electrode 11 is contacted with the p-diffusion region 10 formed in the epitaxial layer 3 through the surface 3a. The base electrode 11 is covered with the remaining insulator film 9.

Figure 2F:
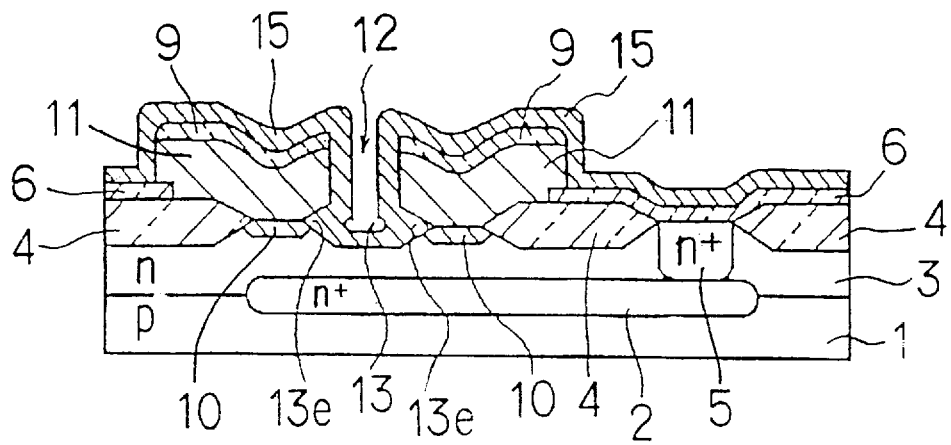

The remaining insulator film 9 and the base electrode 11 are selectively etched by anisotropically dry etching processes, successively, thereby forming an emitter contact hole 12 extending to the central area of the space-formation film 14, as shown in FIG. 2F. During this etching process, the $SiO_2$ film 14 serves as an etching stop. This hole 12 defines the contours of the emitter region and the intrinsic base region and therefore, anisotropically etching processes enabling a vertical inner wall is employed.

Then, the space-formation film 14 is entirely removed by a wet etching process through the emitter contact hole 12. As a result, a space or vacancy 13 is formed on the n-epitaxial layer 3 at the bottom of the hole 12. The space 13 has an end portion 13e whose cross section is similar to a bird's beak at its end. In other words, the end portion 13e has a corresponding shape of the end portion 14e of the film 14. The space 13 is defined by the depressed surface 3a of the epitaxial layer 3 and the remaining base electrode 11. The top of the space 13 communicates with the emitter contact hole 12.

In the method according to the first embodiment, the p-diffusion region 10 is formed to surround the space-formation insulator film 14 and therefore, no dry etching process is required to selectively remove the region 10, as in the above conventional method. Accordingly, the surface 3a of the epitaxial layer 3 needs not to be etched. This means that there is no possibility of damage to the portion of the layer 3 where the intrinsic base region is to be formed.

Next, a p-polysilicon film 15 is deposited to cover the insulator films 9 and 6 by a CVD method over the entire substrate 1. The doping of the p-type impurity is performed during the CVD process or in a doping process to an undoped polysilicon film which has been previously deposited. The thickness of the film 15 is determined so that the film 15 may fill the end portion 13e of the space 13 and may not close the emitter contact hole 12. In the end portion 13e, polysilicon grows upward and downward from the upper and lower inner walls of the portion 13e. Both the polysilicons thus grown are united with each other, filling the end portion 13e.

Figure 2G:
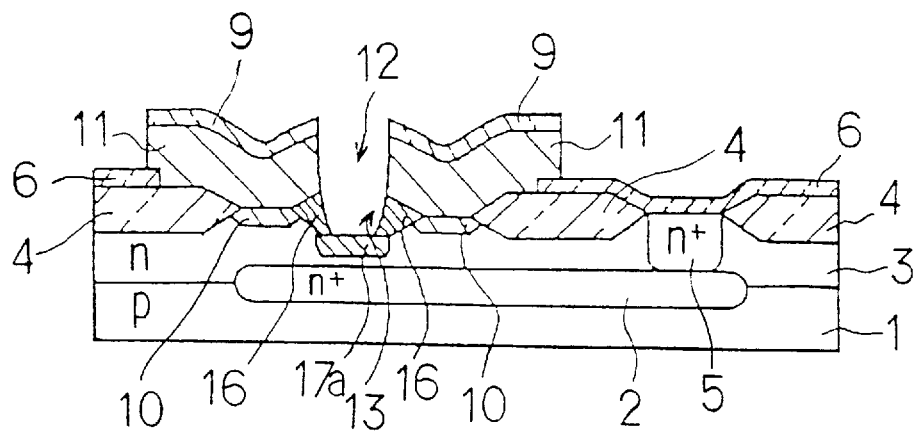

The p-polysilicon film 15 is then removed by an isotropically dry etching process to be left within the end portion 13e of the space 13 alone, as shown in FIG. 2G. This etching process is performed by a comparatively low energy and as a result, the process has no possibility of damage to the n-epitaxial layer 3. Through this process, only a polysilicon film 16 remains in the portion 13e, and the depressed area of the layer 3 positioned at the bottom of the emitter contact hole 12 is exposed again.

Boron atoms are selectively doped into the depressed area of the layer 3 which is placed below the bottom of the space 13 through the hole 12 by an ion-implantation technique or the like. The layer 3 is then subjected to a heat-treatment process to activate the doped boron atoms, thereby forming a p-diffusion region 17a with a specified depth in the layer 3. An intrinsic base region 17 will be formed in the region 17a during a later step. A portion of the layer 3 positioned below the region 17a serves as an n-collector region.

During this heat-treatment process, the boron atoms in the layer 3 are diffused into the remaining polysilicon film 16 also. Therefore, the electrical connection between the p-diffusion region 17 and the polysilicon film 16 is ensured to be produced. The film 17 also serves as another part of the link base region.

In the first embodiment, it can be said that the link base is made of the p-diffusion region 10 and the p-polysilicon film 16. It can also be said that the link base is made of only the p-polysilicon film 16, because the film 16 is directly connected to the base electrode 11 and the p-diffusion region 17.

Figure 2H:
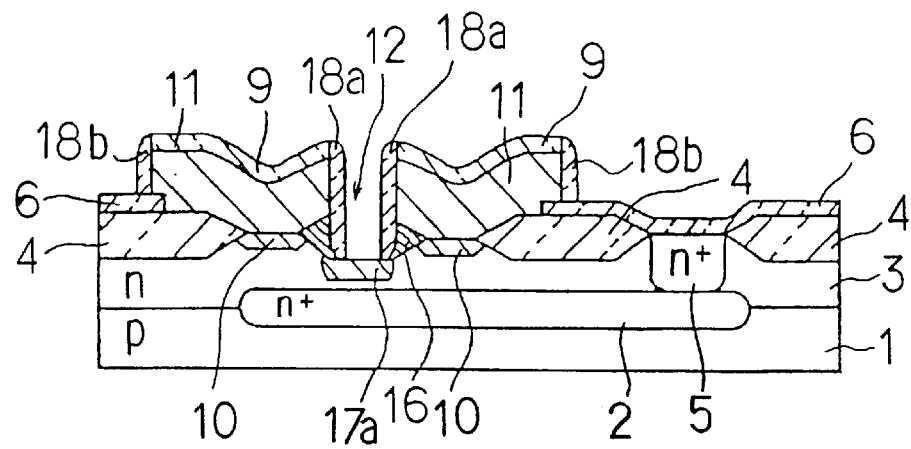

Subsequently, to electrically insulate the base electrode 11 from an emitter electrode 22 to be formed in a following process step, sidewall spacers 18a and 18b made of $SiO_2$ or the like are formed on the inner and outer side walls of the base electrode 11 by a well-known etching back method, respectively, as shown in FIG. 2H. The spacers 18a and 18b have the same lateral thickness (or width) of 100 to 200 nm. The spacer 18a extends from the p-diffusion region 17a to the top of the insulator film 9. The spacer 18b extends from the $SiO_2$ film 6 to the top of the insulator film 9.

An n-polysilicon film heavily doped with arsenic (As) or phosphorus (P) is grown over the entire substrate 1. The film has a thickness of 100 to 200 nm. Alternately, an undoped polysilicon film with a thickness of 100 to 200 nm is grown over the entire substrate 1, and then, As or P is doped into the undoped polysilicon film thus grown by an ion-implantation process. The n-polysilicon film is patterned to thereby form an emitter electrode 12 by a sophisticated processing technique.

The emitter electrode 12 is contacted with the p-diffusion region 17a through the emitter contact hole 12. The electrode 12 is electrically insulated from the base electrode 11 by the sidewall spacer 18a.

Figure 2I:
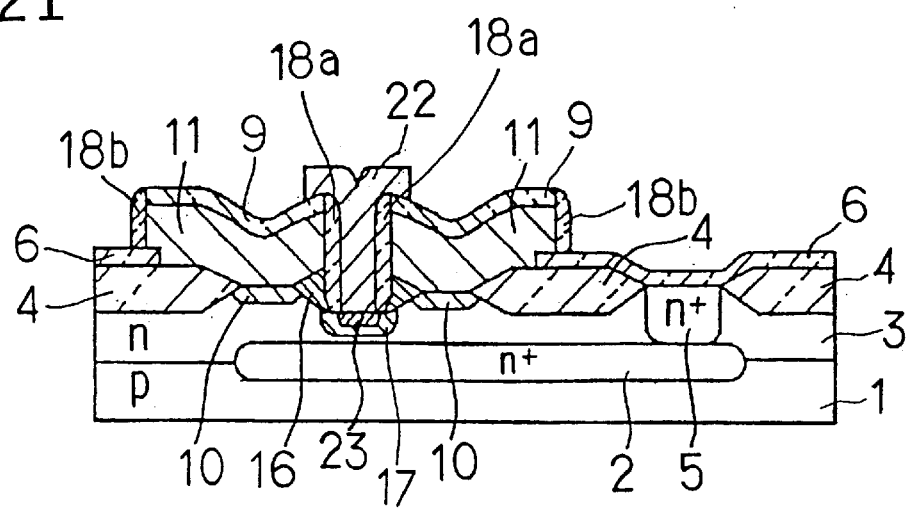
Figure 2J:
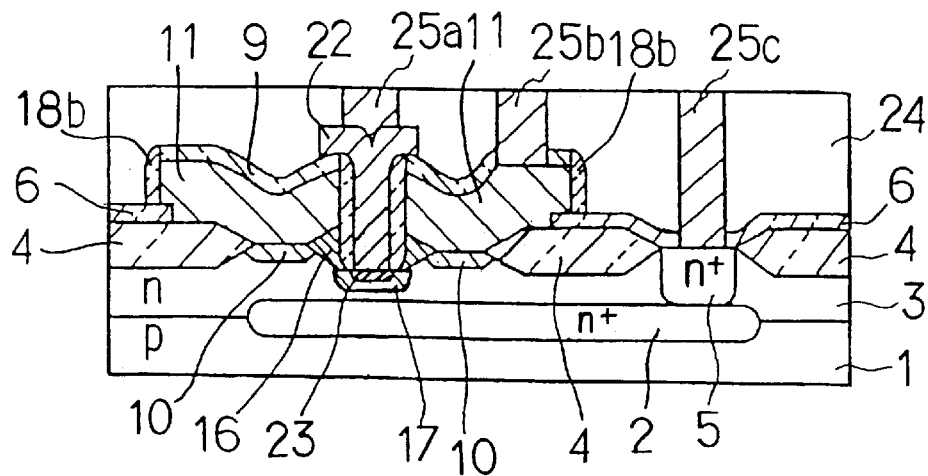

Then, the emitter electrode 12 is subjected to a lamp annealing process in a nitrogen ($N_2$) atmosphere at a temperature of 900° to 1000° C. for 10 to 30 seconds, thereby diffusing the n-impurity atoms doped into the electrode 12 into the p-diffusion region 17a. Thus, an n-emitter region 23 is produced within the region 17a, as shown in FIG. 2I. The remaining region 17a constitutes a p-intrinsic base region 17.

An interlayer insulation film 24 made of $SiO_2$ or the like is formed over the entire substrate 1. Then, three through holes are formed in the film 24 to vertically extend to the emitter electrode 22, the base electrode 11 and the $n^+$-collector contact region 5, respectively, as shown in FIG.

2J. An interconnection film of a metal such as aluminum (Al) is further formed to be patterned, thereby forming interconnection conductors 25a, 25b and 25c within the through holes in the film 24, respectively. Thus, the npn bipolar transistor is fabricated on the substrate 1.

As described above, with the fabrication method according to the first embodiment, the n-silicon epitaxial layer 3 of the p-silicon substrate 1 has a recess or depression formed on the surface 3a, and the polysilicon film 16 is produced by supplying a polysilicon to the recess to be contacted with the intrinsic base region 17 and the base electrode 11. Therefore, the base electrode 11 can be electrically connected to the intrinsic base region 17 by the polysilicon film 16 with high reliability.

Also, since no region or layer serving as a link base region is formed on the emitter/base area 7, there is no possibility of damage to the intrinsic base region 17.

Further, there is no possibility that the boron atoms doped into the p-diffusion region 10a are left so that the depth of the intrinsic base region 17 becomes large, and that the intrinsic base region 17 tends to be apart from the link base region 10 so that open circuit between the regions 17 and 10 and base resistance increase occur.

With the semiconductor device thus fabricated, the p-intrinsic base region 17 is formed in the n-epitaxial layer 3. The n-emitter region 23 is formed in the layer 3 to be surrounded by the intrinsic base region 17. The emitter electrode 22 is formed to be contacted with the n-emitter region 23. The insulating sidewall spacer 18a is formed to surround the emitter electrode 22. The base electrode 11 is formed not to be contacted with the intrinsic base region 17. The remaining polysilicon film 16 in the vacancy, which serves as the conductive region, is formed to be contacted with the intrinsic base region 17 and the base electrode 11.

The base electrode 11 is electrically insulated from the emitter electrode 22 by the sidewall spacer 18a. The n-silicon epitaxial layer 3 has the recess or depression formed on the surface 3a. The polysilicon film 16 serving as the conductive region is produced by supplying a polysilicon to the recess to be contacted with the intrinsic base region 17 and the base electrode 11. Thus, the intrinsic base region 17 is electrically connected to the base electrode 11 through the polysilicon conductor 16.

Accordingly, the base electrode 11 can be electrically connected to the intrinsic base region 17 by the polysilicon conductor region 16 with high reliability.

Also, since no region or layer serving as the link base region needs to be formed on an area where the intrinsic base region 17 is formed, there is no possibility of damage to the region 17.

SECOND EMBODIMENT

A fabrication method of a semiconductor device with a bipolar transistor according to a second embodiment is shown in FIGS. 3A to 3J.

This method contains the same process steps as those in the method according to the first embodiment and therefore, the description relating to the same steps is omitted here by adding the same reference numerals to the corresponding elements for simplification.

Figure 3A:
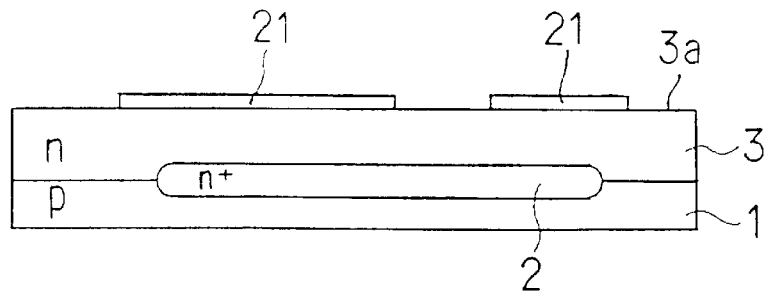
FIGS. 3A to 3J are partial cross-sectional views of a semiconductor device with a bipolar transistor according to a second embodiment of the invention, which shows its fabrication process sequence, respectively.
Figure 3B:
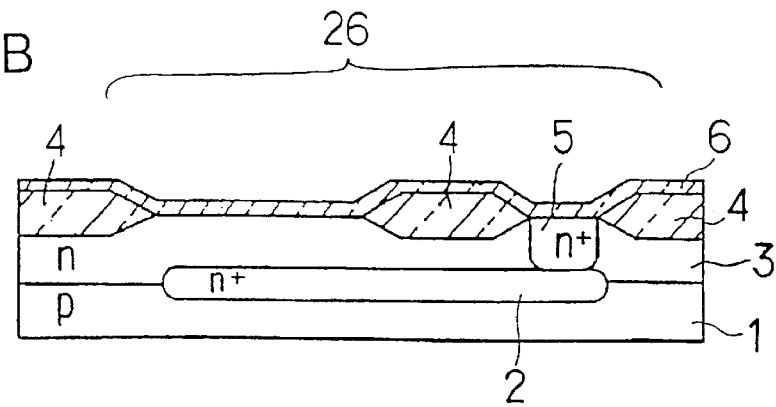

The process steps as shown in FIGS. 3A and 3B are the same as those in the first embodiment shown in FIGS. 2A to 2C except that the space-formation insulator film 14 is not formed on the n-silicon epitaxial layer 3 and that the thin SiO$_2$ film 6 with a thickness of 50 to 100 nm is not patterned to cover the entire exposed surface of the substructure.

Subsequently, a p-polysilicon film 8 with a thickness of 300 to 400 nm is deposited over the entire substrate 1 by a CVD method. The film 8 is obtained by doping the p-type impurity such as boron during the CVD process. However, the film 8 may be produced by doping the p-type impurity by an ion-implantation method into an undoped polysilicon film which has been previously deposited.

An insulator film 9 such as Si$_3$N$_4$ is formed on the p-polysilicon film 8 over the entire substrate 1 in order to electrically insulate a base electrode from an emitter electrode. The film 8 is then subjected to a heat-treatment at a temperature of 900° to 950° C. for 10 to 30 minutes to activate the p-impurity contained in the film 8.

Figure 3C:
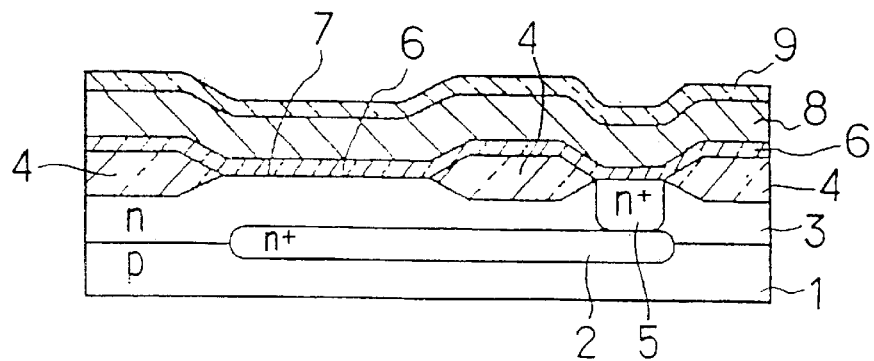

Unlike the method of the first embodiment, during this heat-treatment process, the doped p-impurity atoms in the film 8 are not diffused into the n-silicon epitaxial layer 3 through its exposed surface 3a, because the surface 3a of the epitaxial layer 3 is entirely covered with the SiO$_2$ film 6. As a result, the p-diffusion region 10 shown in the first embodiment is not formed in the emitter/base area 7. The state at this stage is shown in FIG. 3C.

Figure 3D:
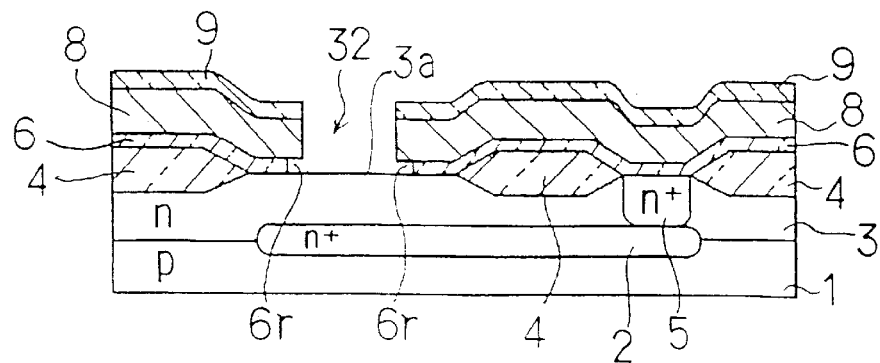

Next, the p-polysilicon film 8 and the insulator film 9 are selectively removed to be patterned by plasma-enhanced anisotropically dry etching processes, respectively, thereby forming an emitter contact hole 32. During this etching processes, the SiO$_2$ film 6 serves as an etching stop. The film 6 is then removed by a wet etching process through the hole 32. During this wet etching process, the film 6 is laterally etched and therefore, a gap 6r is produced under the polysilicon film 8, as shown in FIG. 3D. In other words, the emitter contact hole 32 has an expanded portion 6r at its bottom.

In the method according to the second embodiment, similar to the first embodiment, the p-diffusion region 10 is not formed in the n-epitaxial layer 3 and therefore, no dry etching process is required to remove the region 10. Accordingly, the surface 3a of the epitaxial layer 3 needs not to be etched. This means that there is no possibility of damage to the portion of the layer 3 where the intrinsic base region is to be formed.

Figure 3E:
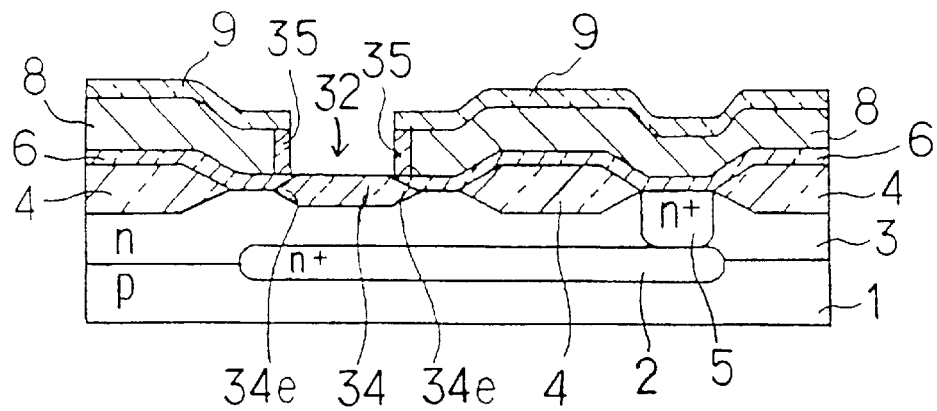

Using the Si$_3$N$_4$ film 9 as a mask, the n-silicon layer 3 is thermally and selectively oxidized in an oxidizing atmosphere at a temperature of 950° to 1000° C. by a LOCOS method. Thus, the exposed surface 3a of the silicon layer 3 is oxidized in the emitter contact hole 32, resulting in a space-formation SiO$_2$ film 34 with a thickness of 100 to 200 nm, as shown in FIG. 3E. The thickness of the film 34 is equal to an approximately half of the thickness of the space-formation insulator film 14 in the first embodiment.

The film 34, which is formed like an island on the layer 3 within the emitter contact hole 32, defines a space or vacancy for electric connection between an intrinsic base region and a base electrode. Since the film 34 is formed by the LOCOS method, it has a laterally protruding end portion 34e termed the "bird's beak". The end portion 34e has a thickness gradually decreasing from the central portion toward the edge. As shown in FIG. 3E, an upper part of the film 34 in its cross-section protrudes from the flat surface 3a, and a lower part thereof sinks in the epitaxial layer 3.

During this oxidation process, the side face of the p-polysilicon film 8 also is oxidized to be covered with an SiO$_2$ film 35. The polysilicon film 8 is activated again during this process. However, the film 8 is not contacted with the epitaxial layer 3 and therefore, no p-type region is formed in the layer 3 through this oxidation process.

The space-formation film 34 is then removed by a wet etching process, thereby forming a space or vacancy 33 on the n-silicon epitaxial layer 3. During this process, the $SiO_2$ film 35 is entirely removed from the p-polysilicon film 8, and the inner end face of the $SiO_2$ film 6 which is exposed to the emitter contact hole 32 is etched. Thus, the end face of the film 6 is shifted toward the neighboring isolation insulator film 4, and as a result, an extended gap 6r' is formed under the film 8. Additionally, a gap 33e is formed at a corresponding position to the bird's beak of the film 34.

Figure 3F:
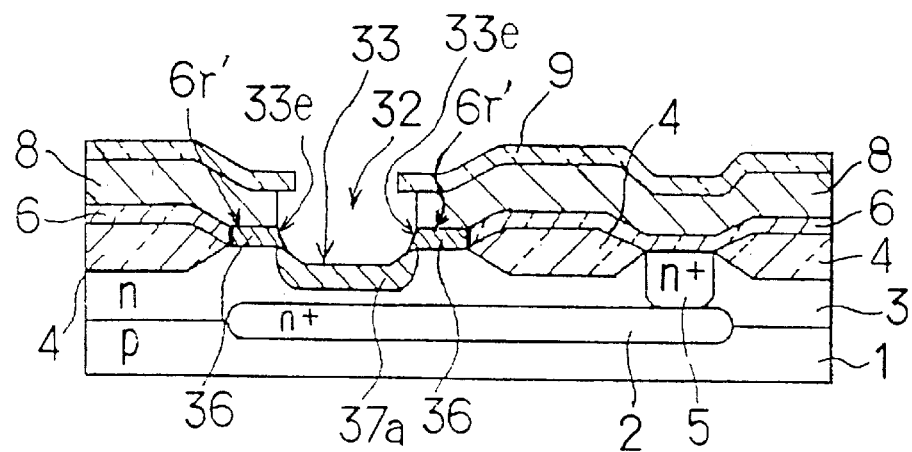

Subsequently, a p-polysilicon film 36 is deposited by a CVD method over the entire substrate 1. Similar to the first embodiment, the doping of the p-impurity may be performed simultaneously the CVD process or after the formation of an undoped polysilicon film. The p-polysilicon film 36 is then removed by an isotropically dry etching process to be left within the end portion 33e of the space 33 and the extended gap 6r' alone, as shown in FIG. 3F. This etching process is performed by a comparatively low energy and as result, the process has no possibility of damage to the n-epitaxial layer 3. Through this process, the depressed area of the n-silicon epitaxial layer 3 positioned at the bottom of the emitter contact hole 32 is exposed again.

The thickness of the polysilicon film 36 is determined so that the film 36 may fill the end portion 33e and the extended gap 6r' and may not close the emitter contact hole 32. In the portion 33e and the gap 6r', polysilicon grows upward and downward from their upper and lower inner walls. Both the polysilicons thus grown are united with each other, filling the portion 33e and the gap 6r'.

Boron atoms are selectively doped into the depressed area of the layer 3 which is placed below the bottom of the space 33 through the hole 32 by an ion-implantation technique or the like. The layer 3 is then subjected to a heat-treatment process to activate the doped boron atoms, thereby forming a p-diffusion region 37a with a specified depth in the layer 3. An intrinsic base region 37 will be formed in the region 37a during a later step. A portion of the layer 3 positioned below the region 37 serves as an n-collector region.

During this heat-treatment process, the boron atoms in the layer 3 are diffused into the remaining polysilicon film 36 in the gap 6r' also. Therefore, the electrical connection between the p-diffusion region 37a and the polysilicon film 36 is ensured to be produced. The film 37 also serves as another part of the link base region.

In the second embodiment, it can be said that the link base region is made of the remaining p-polysilicon film 36. It can also be said that the link base is made of only the p-polysilicon film 36, because the polysilicon film 36 is directly connected to the p-diffusion region 37a and the p-polysilicon film 8 which forms a base electrode 11 in a later process step.

Figure 3G:
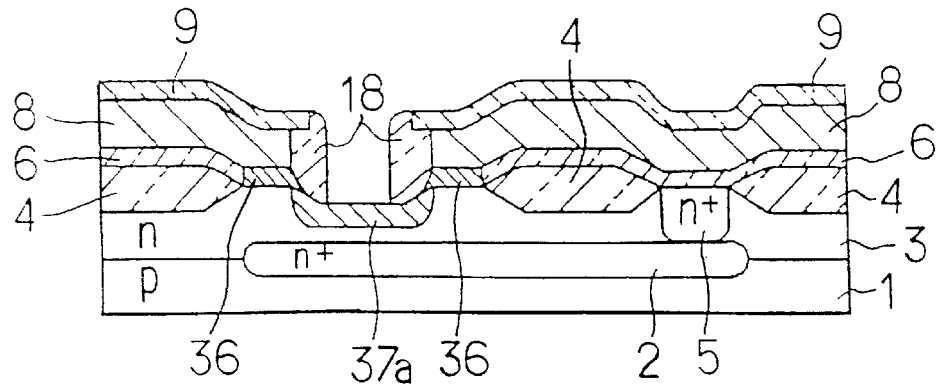

Subsequently, in the same manner as that in the first embodiment, a sidewall spacer 18 made of $SiO_2$ or the like is formed on the inner side walls of the polysilicon film 8 and the remaining polysilicon film 36, as shown in FIG. 3G. The spacer 18 extends from the p-diffusion region 37a to the top of the insulator film 9.

Figure 3H:
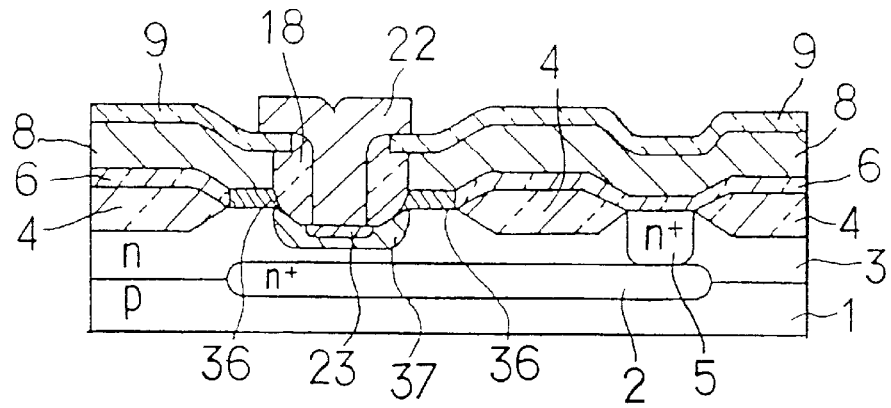

Further, in the same manner as those in the first embodiment, an n-polysilicon film is grown over the entire substrate 1, and then, it is patterned to thereby form an emitter electrode 22, as shown in FIG. 3H. The emitter electrode 22 is contacted with the p-diffusion region 37a through the emitter contact hole 32. The electrode 22 is electrically insulated from the polysilicon film 8 by the sidewall spacer 18. The emitter electrode 22 is subjected to a lamp annealing process, thereby diffusing the n-impurity atoms doped into the electrode 22 into the p-diffusion region 37a. Thus, an n-emitter region 23 is produced within the region 37a, as shown in FIG. 3H. The remaining region 37a constitutes a p-intrinsic base region 37.

Figure 3I:
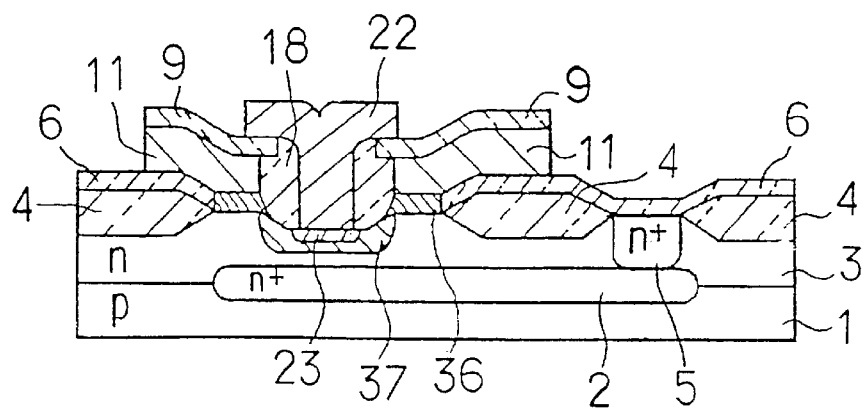
Figure 3J:
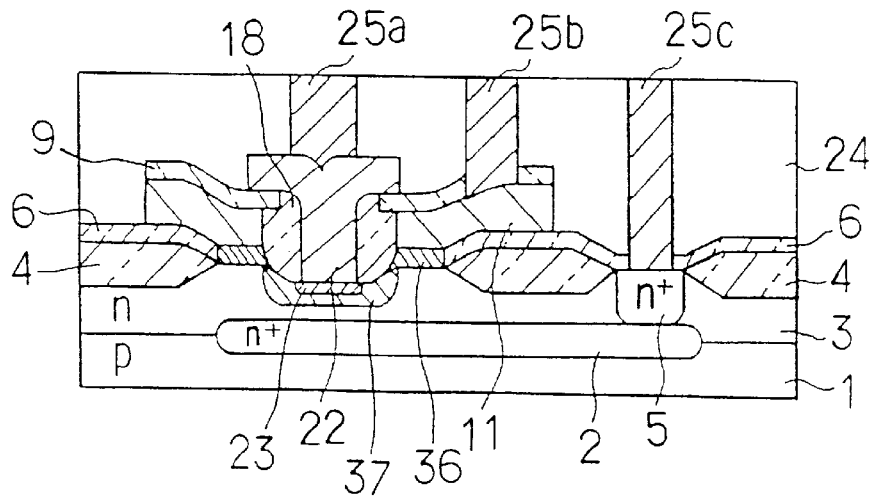

Next, in the same manner as those in the first embodiment, the polysilicon film 8 and the $Si_3N_4$ film 9 are patterned to form a base electrode 11, as shown in FIG. 3I. After an interlayer insulation film 24 made of $SiO_2$ or the like is formed over the entire substrate 1, three through holes are formed in the film 24 to vertically extend to the emitter electrode 22, the base electrode 11 and the $n^+$-collector contact region 5, respectively, as shown in FIG. 3J. An interconnection film of a metal such as aluminum (Al) is further formed to be patterned, thereby forming interconnection conductors 25a, 25b and 25c within the though holes in the film 24, respectively. Thus the npn bipolar transistor is fabricated on the substrate 1.

As described above, with the fabrication method according to the second embodiment, the same advantages as those in the first embodiment is obtained.

Further, with the fabrication method according to the second embodiment, the isolation insulator film 4 and the space-formation insulator film 34 are produced in the different, selective oxidation processes. On the other hand, with the method of the first embodiment, the isolation insulator film 4 and the space-formation insulator film 14 are produced in the same selective oxidation process.

Therefore, the method according to the first embodiment has an additional advantage of the reduced number of the necessary process steps compared with that of the second embodiment. However, the method of the second embodiment has an advantage that the thickness of the space-formation insulator film 34 can be designed according to the necessary performance of the bipolar transistor independent of the thickness of the isolation insulator film 4. For example, if the film 34 is formed to be thin, the dimension of the link base region can be reduced, which leads to base resistance reduction.

With the semiconductor device thus fabricated according to the second embodiment, the p-intrinsic base region 37 is formed in the n-epitaxial layer 3. The n-emitter region 23 is formed in the layer 3 to be surrounded by the intrinsic base region 37. The emitter electrode 22 is formed to be contacted with the n-emitter region 23. The insulating sidewall spacer 18 is formed to surround the emitter electrode 22. The base electrode 11 is formed not to be contacted with the intrinsic base region 37. The remaining polysilicon film 36 in the gap 6r', which serves as the conductive region, is formed to be contacted with the intrinsic base region 37 and the base electrode 11.

The base electrode 11 is electrically insulated from the emitter electrode 22 by the sidewall spacer 18. The n-silicon epitaxial layer 3 has the recess or depression formed on the surface 3a. The remaining polysilicon film 36 serving as the conductive region is produced by supplying a polysilicon to the gap 6r' to be contacted with the intrinsic base region 37 and the base electrode 11. Thus, the intrinsic base region 37, is electrically connected to the base electrode 11 through the polysilicon conductor 36.

Accordingly, the base electrode 11 can be electrically connected to the intrinsic base region 37 by the polysilicon conductor region 36 with high reliability.

Also, since no region or layer serving as the link base region needs to be formed on an area where the intrinsic base region 37 is formed, there is no possibility of damage to the region 37.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method for a semiconductor device, said method comprising the steps of:
   preparing a semiconductor substructure having a surface area of a first conductivity type;
   forming a recess on said surface area;
   forming an intrinsic base region of a second conductivity type in said surface area, said second conductivity type being opposite to said first conductivity type;
   forming an emitter region of said first conductivity type in said surface area surrounded by said intrinsic base region;
   forming an emitter electrode contacting said emitter region;
   forming an insulator surrounding said emitter electrode;
   forming a base electrode electrically insulated from said intrinsic base region by said insulator; and
   forming a conductive region contacting said intrinsic base region and said base electrode,
   wherein a conductive material is supplied to said recess to produce said conductive region, said conductive region having a laterally protruding end having a cross-sectional shape of a bird's beak, so that said intrinsic base region is electrically connected to said base electrode through said conductive region through said laterally protruding end.

2. The method as claimed in claim 1, wherein said a cross-sectional shape of said conductive region is produced by oxidizing a part of said surface area of said substructure with local oxidation of silicon (LOCOS) to form an oxide.

3. The method as claimed in claim 2, further comprising the steps of:
   forming a conductive material for said base electrode on said oxide;
   forming an emitter contact hole penetrating said conductive material to expose said oxide; and
   removing said oxide by wet etching through said emitter contact hole.

4. The method as claimed in claim 1, further comprising the steps of:
   forming an insulator film on said surface area of said substructure;
   forming a conductive material for said base electrode on said insulator film;
   forming an emitter contact hole penetrating said material to expose said insulator film; and
   removing said insulator film by wet etching through said emitter contact hole.

5. A method of forming a bipolar transistor, comprising the steps of:
   forming a buried layer having a first conductivity type in a first single crystal silicon substrate of a second conductivity type;
   growing a second single crystal layer on said first single crystal covering said buried layer;
   forming three spaced oxidation resistance patterns on said second single crystal layer;
   forming four space-formation insulator layers between each of said spaced oxidation resistance patterns, each of said space-formation insulator layers having laterally protruding ends having a cross-sectional shape comprising a bird's beak beneath ends of said space-formation insulator layers;
   forming a collector under a third of said spaced oxidation resistance patterns between two of said space-formation insulator layers;
   forming a base electrode over a first, second, and third of said four space-formation insulator layers;
   etching an emitter contact hole through said base electrode removing said second space-formation insulator layer;
   forming an intrinsic base region and an emitter region at a bottom of said emitter contact hole; and
   growing a polysilicon layer in said contact hole, wherein said polysilicon layer has a cross-section comprising a bird beak shape and provides an electrical connection between said base electrode and said intrinsic base region.

6. A method of forming a bipolar transistor as recited in claim 5 wherein said buried layer comprises an n+ conductivity type.

7. A method of forming a bipolar transistor as recited in claim 5 wherein said first single crystal comprises p-type and said second single crystal comprises n-type.

8. A method of forming a bipolar transistor as recited in claim 5 wherein said step of etching an emitter contact hole comprises a step of anisotropically dry etching.

9. A method of forming a bipolar transistor as recited in claim 5 further comprising the step of annealing said emitter electrode in a nitrogen atmosphere.

10. A method of forming a bipolar transistor as recited in claim 9 wherein said anneal step comprises lamp annealing.

11. A method of forming a bipolar transistor as recited in claim 10 wherein said step of lamp annealing is conducted at a temperature 900°–1000° C.

12. A method of forming a bipolar transistor as recited in claim 11 wherein said step of lamp annealing is conducted for 10–30 seconds.

* * * * *